United States Patent [19]
Kato et al.

[11] Patent Number: 6,069,020
[45] Date of Patent: May 30, 2000

[54] METHOD OF MANUFACTURING SEMICONDUCTOR LIGHT-EMITTING DEVICE

[75] Inventors: Eisaku Kato; Hiroyasu Noguchi; Masaharu Nagai, all of Kanagawa, Japan

[73] Assignee: Sony Corporation, Tokyo, Japan

[21] Appl. No.: 09/189,680

[22] Filed: Nov. 13, 1998

[30] Foreign Application Priority Data

Nov. 14, 1997 [JP] Japan ..................................... 9-314072
Feb. 6, 1998 [JP] Japan ............................... P10-025372

[51] Int. Cl.[7] ................................................. H01L 21/00
[52] U.S. Cl. .............................. 438/46; 438/930; 257/78; 257/103; 257/201; 257/614; 372/44; 372/45
[58] Field of Search ........................ 438/46, 930; 257/78, 257/103, 201, 614; 372/44, 45

[56] References Cited

U.S. PATENT DOCUMENTS

| 5,296,718 | 3/1994 | Fujita et al. ............................. 257/14 |
| 5,433,170 | 7/1995 | Toda et al. ............................. 117/103 |
| 5,705,831 | 1/1998 | Uemura et al. ........................... 257/78 |
| 5,766,345 | 6/1998 | Tomiya et al. ......................... 117/105 |
| 5,780,322 | 7/1998 | Tamamura et al. ....................... 438/45 |

*Primary Examiner*—Wael Fahmy
*Assistant Examiner*—Long Pham
*Attorney, Agent, or Firm*—Hill & Simpson

[57] ABSTRACT

In a method of manufacturing a semiconductor light-emitting device composed of a II–VI compound semiconductor in which at least more than one kind of elements of Zn, Be, Mg, Cd or Hg are used as a II-group element and at least more than one kind of elements of Se, S, Te are used as a VI-group element and which includes first conductivity type and second conductivity type cladding layers and an active layer, a supply ratio VI/II ratio of VI-group element and II-group element required when the active layer is epitaxially deposited is selected to be greater than 1.1 and the active layer is deposited epitaxially. Thus, there may be obtained a highly-reliable semiconductor light-emitting device whose life time is made longer.

9 Claims, 5 Drawing Sheets

METHOD OF MANUFACTURING SEMICONDUCTOR LIGHT-EMITTING DEVICE

BACKGROUND OF THE INVENTION

1. Field of the Invention

The present invention relates to a method of manufacturing a semiconductor light-emitting device, and particularly to a method of manufacturing a II–VI compound semiconductor light-emitting device capable of emitting light of green or blue color.

2. Description of the Related Art

Recently, there is an increasing demand of recording/reproducing information on and from an optical disc or a magnetooptical disc at a high density with a high resolution. Also, there is an increasing demand of a high-luminance display device and a low-loss optical fiber communication apparatus. Further, since there is an increasing trend of developing an optical analyzer for analyzing a DNA or a specific chemical substance, there is an increasing demand of developing a semiconductor light-emitting device capable of emitting light of green color or blue color as a light source of such optical analyzer.

As a material for making such a semiconductor light-emitting device capable of emitting light of green color or blue color, a II–VI compound semiconductor made of at least one of zinc (Zn), magnesium (Mg), beryllium (Be), cadmium (Cd) and mercury (Hg) of II-group elements and at least one of oxygen (0), sulfur (S), selenium (Se) and tellurium (Te) of VI-group elements is a promising material.

Of the above-mentioned materials, a material using a ZnMgSSe-based material is particularly promising as a cladding layer. A contact layer for ohmic-contacting an electrode is generally formed of a ZnTe layer or a superlattice structure containing the ZnTe layer (e.g. superlattice structure based on a ZnTe/ZnS superlattice and superlattice structure formed of a mixed crystal of ZnSeTe).

These structures are deposited by a MBE (molecular beam epitaxy) method, for example.

Therefore, since a crystallinity has not been satisfactory or the suppression of deterioration has not been sufficient, the semiconductor light-emitting device has been deteriorated when oscillated to emit laser beams. There is then the problem that the life time of the conventional semiconductor light-emitting device cannot be extended.

In the prior art, one of the causes that the semiconductor light-emitting device, e.g. semiconductor laser is deteriorated is mainly the deterioration or breakage of the inside of an active layer or the peripheral portion of the active layer. There is then the problem that it becomes more difficult to extend the life time of the semiconductor light-emitting device.

SUMMARY OF THE INVENTION

In view of the aforesaid aspect, it is an object of the present invention to provide new conditions under which an active layer is grown.

It is another object of the present invention to provide a device of higher crystallinity by optimizing conditions under which an active layer and a peripheral portion of the active layer are grown during a semiconductor laser structure is grown.

According to the present invention, in a method of manufacturing a semiconductor light-emitting device composed of a II–VI compound semiconductor in which at least more than one kind of elements of Zn, Be, Mg, Cd or Hg are used as a II-group element and at least more than one kind of elements of Se, S, Te are used as a VI-group element and which includes first conductivity type and second conductivity type cladding layers and an active layer, a supply ratio VI/II ratio of VI-group element and II-group element required when the active layer is epitaxially deposited is selected to be greater than 1.1 and said active layer is deposited epitaxially.

Although the supply ratio VI/II ratio of VI-group element and II-group element required when the active layer is epitaxially deposited according to the present invention will be described later on, a ratio of intensities of molecular beams supplied when the film is epitaxially deposited, in particular, the active layer is epitaxially deposited by the apparatus used to epitaxially deposit the layer is determined in such a manner that a stoichiometric condition is that the VI/II ratio is 1.

As described above, according to the manufacturing method of the present invention, when the active layer is epitaxially deposited, the VI/II ratio thereof is shifted in the plus direction from 1, and its life time of semiconductor light-emitting device could be improved considerably as compared with the conventional semiconductor light-emitting device. That is, in the prior-art idea, the condition that the VI/II ratio is 1 demonstrates the best crystallinity, and in that case, there may be obtained a semiconductor light-emitting device whose life time is the longest. The method of the present invention reverses this prior-art idea.

DESCRIPTION OF THE PREFERRED EMBODIMENT

A method of manufacturing a semiconductor light-emitting device according to an embodiment of the present invention will be described.

Prior to the description of the present invention, a fundamental principle of the present invention will be summarized as follows:

In a method of manufacturing a semiconductor light-emitting device, e.g. semiconductor laser composed of a II–VI compound semiconductor in which at least more than one kind of elements of Zn, Be, Mg, Cd or Hg are used as a II-group element and at least more than one kind of elements of Se, S, Te are used as a VI-group element and which includes first conductivity type and second conductivity type cladding layers and an active layer, a supply ratio VI/II of VI-group element and II-group element required when the active layer is epitaxially deposited is selected to be greater than 1.1 and then active layer is deposited epitaxially.

A supply VI/II ratio required when the active layer is epitaxially deposited is selected to be greater than 1.1, more preferably larger than 1.5 and above all, selected in a range of from 1.5 to 10. When the VI/II ratio is selected to be greater than 1.1, in particular, selected to be greater than 1.5, the life time of the semiconductor light-emitting device may be extended much longer. Further, when the VI/II ratio is selected in a range of from 1.5 to 3.0 to grow the active layer, it is possible to manufacture a highly-reliable semiconductor light-emitting device whose life time is made longer. Then, from a standpoint of an apparatus for epitaxially depositing a layer, if the VI/II ratio is selected to be 10, then it was confirmed that the effect for improving the life time could not be achieved so much and that a waste of a raw material, in particular, VI-group element is increased.

Then, in the semiconductor light-emitting device manufactured by the method of the present invention, it was confirmed that the present invention is effective particularly when the active layer is comprised of a ZnCdSe or ZnCdSSe layer or a ZnCdBeSe layer.

A semiconductor light-emitting device according to an embodiment of the present invention will be described with reference to FIG. 1.

Figure 1:
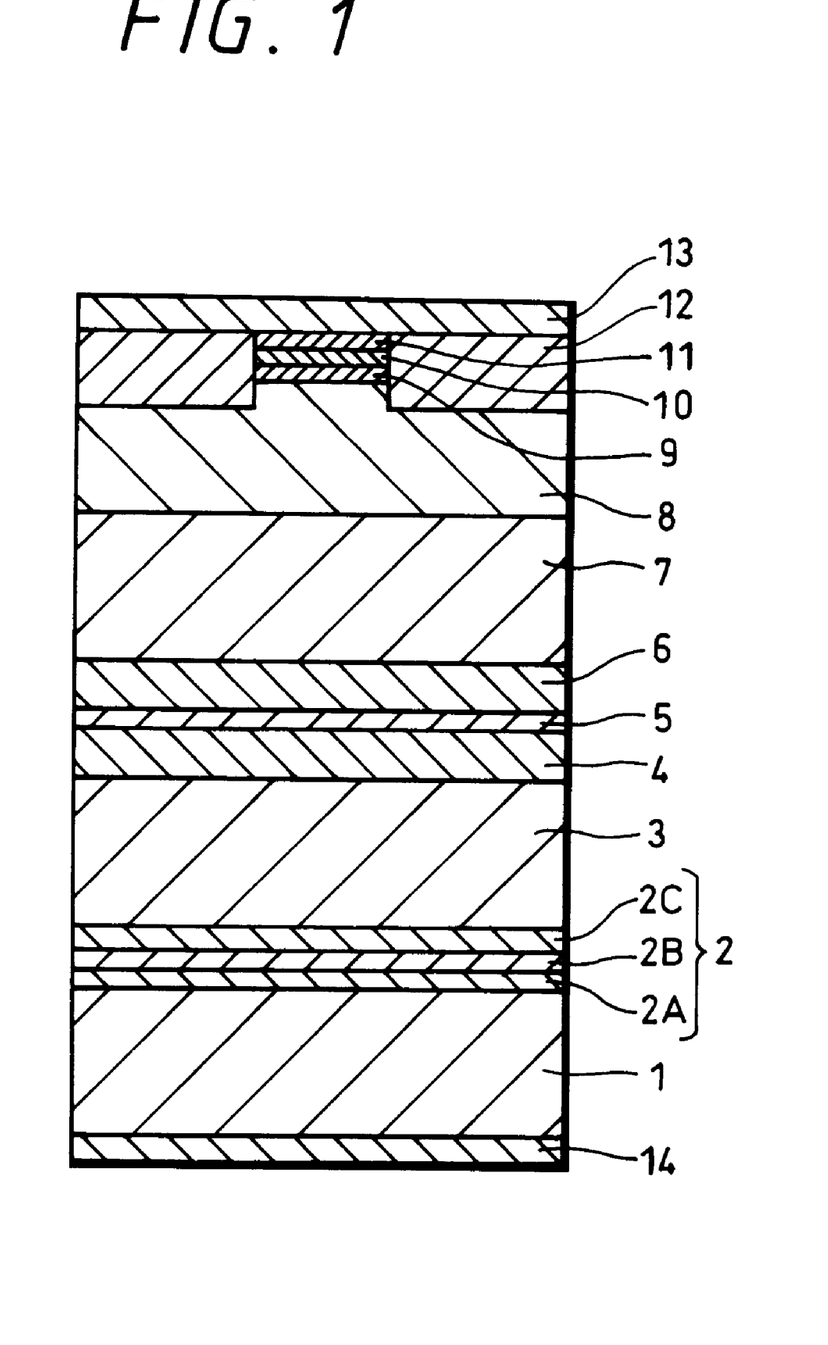
FIG. 1 is a schematic cross-sectional view showing an example of a semiconductor light-emitting device obtained by a manufacturing method of the present invention.

FIG. 1 of the accompanying drawings is a schematic cross-sectional view illustrating an example of a semiconductor light-emitting device which is applied to a blue/green semiconductor laser formed of II–VI compound semiconductor.

In this embodiment, while an active layer is of a single quantum well structure, the active layer is not limited to the single quantum well structure and may be of a multiple quantum well structure. Of course, the semiconductor light-emitting device according to this invention is not limited to an example which will be described below with reference to FIG. 1.

In the example of FIG. 1, on a first conductivity type, e.g. n-type substrate 1, there are epitaxially deposited a first conductivity type buffer layer 2, a first conductivity-type cladding layer 3, a first guiding layer 4, an active layer 5 of quantum well structure, a second guiding layer 6, a second conductivity-type, e.g. p-type cladding layer 7, a second conductivity-type first semiconductor layer 8, a second conductivity-type second semiconductor layer 9, a second conductivity-type superlattice layer 10 and a second conductivity-type contact layer 11, in that order, by the MBE (molecular beam epitaxy) method, for example.

Across the thickness direction of the contact layer 11 and the superlattice structure 10 of the laminated semiconductor layer thus epitaxially deposited and on both sides of a stripe-like current path portion, there is formed a mesa-groove by chemical etching using etchant or dry etching. An insulating layer 12 made of $Al_2O_3$ or the like is buried in this mesa-groove.

Then, one electrode 13 is deposited on the contact layer 11 in an ohmic-contact fashion, and the other electrode 14 is deposited on the back surface of the substrate 1 in an ohmic-contact fashion.

The substrate 1 has a thickness ranging from 100 to 350 μm and is formed of an n-type GaAs to which silicon (Si) is added as an n-type impurity.

The buffer layer 2 is comprised of a buffer layer 2A made of III–V compound semiconductor, for example, and first and second buffer layers 2B and 2C made of II–VI compound semiconductor. The buffer layer 2A is made of an n-type GaAs having a laminated-direction thickness (hereinafter simply referred to as a thickness) of 200 nm and to which silicon is added as an n-type impurity. The first II–VI-group buffer layer 2B is made of an n-type ZnSe having a thickness of 20 nm, for example, and to which chlorine (Cl) is added as an n-type impurity. The second II–VI-group buffer layer 2C is made of an n-type ZnSSe having a thickness of 200 nm, for example, and to which chlorine (Cl) is added as an n-type impurity.

The first conductivity-type cladding layer 3 is made of an n-type ZnMgSSe mixed crystal layer having a thickness of 1 μm, for example, and to which chlorine is added as an n-type impurity.

The first guiding layer 4 is made of a ZnSSe mixed crystal layer having a thickness of 100 nm, for example, and to which chlorine is added as an n-type impurity or made of a non-doped ZnSSe mixed crystal. A mole fraction in VI-group element of ZnSSe mixed crystal comprising the first guide layer 4 is 6% of S (sulfur) and 94% of Se(selenium), for example.

The active layer 5 is made of a ZnCdSe mixed crystal layer of a single quantum well structure having a thickness of 3.3 nm, for example. A mole fraction of II-group element is 67% of zinc and 33% of cadmium for example, and its lattice constant is slightly larger than a lattice constant $a_{sub}$ (GaAs lattice constant) of the substrate 1.

The second guiding layer 6 is made of a ZnSSe mixed crystal layer having a thickness of 100 nm, for example and to which it nitrogen (N) is added as a p-type impurity, for example, or a non-doped ZnSSe mixed crystal. A mole fraction in VI-group element of the ZnSSe mixed crystal comprising the second guide layer 6 is 6% of sulfur and 94% of selenium, for example.

The second conductivity-type cladding layer 7 is made of a p-type ZnMgSSe mixed crystal layer having a thickness of 1 μm, for example, and to which nitrogen is added as a p-type impurity.

The first semiconductor layer 8 is made of a p-type ZnSSe mixed crystal layer having a thickness of 2 μm, for example, and to which nitrogen is added as a p-type impurity.

The second semiconductor layer 9 is made of a p-type ZnSe layer having a thickness of 100 nm, for example, and to which nitrogen is added as a p-type impurity.

Further, the superlattice layer 10 is made of a superlattice layer of a laminated layer of a p-type ZnSe layer and a p-type ZnTe layer, for example.

The contact layer 11 is made of a p-type ZnTe layer having a thickness of 50 nm, for example.

The mesa-groove is formed on both sides of the stripe-like pattern by pattern-etching the thus laminated semiconductor layer by photolithography. Specifically, a stripe-like photoresist layer having a width of 10 μm is formed on the contact layer 11 by photoresist coating, pattern exposure and development. By using this photoresist layer as an etching mask, the laminated semiconductor layer is etched to the depth crossing the contact layer 11 and the superlattice layer 10 by etchant as shown in FIG. 1 or the laminated semiconductor layer is etched to the depth of the second conductivity-type cladding layer 7 although not shown.

Thereafter, the insulating layer 12 is deposited by vapor deposition of alumina ($Al_2O_3$) or the like, for example.

Thereafter, the photoresist layer is removed from the surface, and the electrode 13, i.e. p-side electrode 13 in this example is deposited on the insulating layer 12. This electrode 13 is formed by laminating a titanium (Ti) layer having a thickness of 10 nm, for example, and a gold (Au) layer having a thickness of 300 nm, for example. On the back surface of the substrate 1, there is formed the electrode 14 made of indium (In), i.e. n-side electrode 14 in this example.

Figure 2:
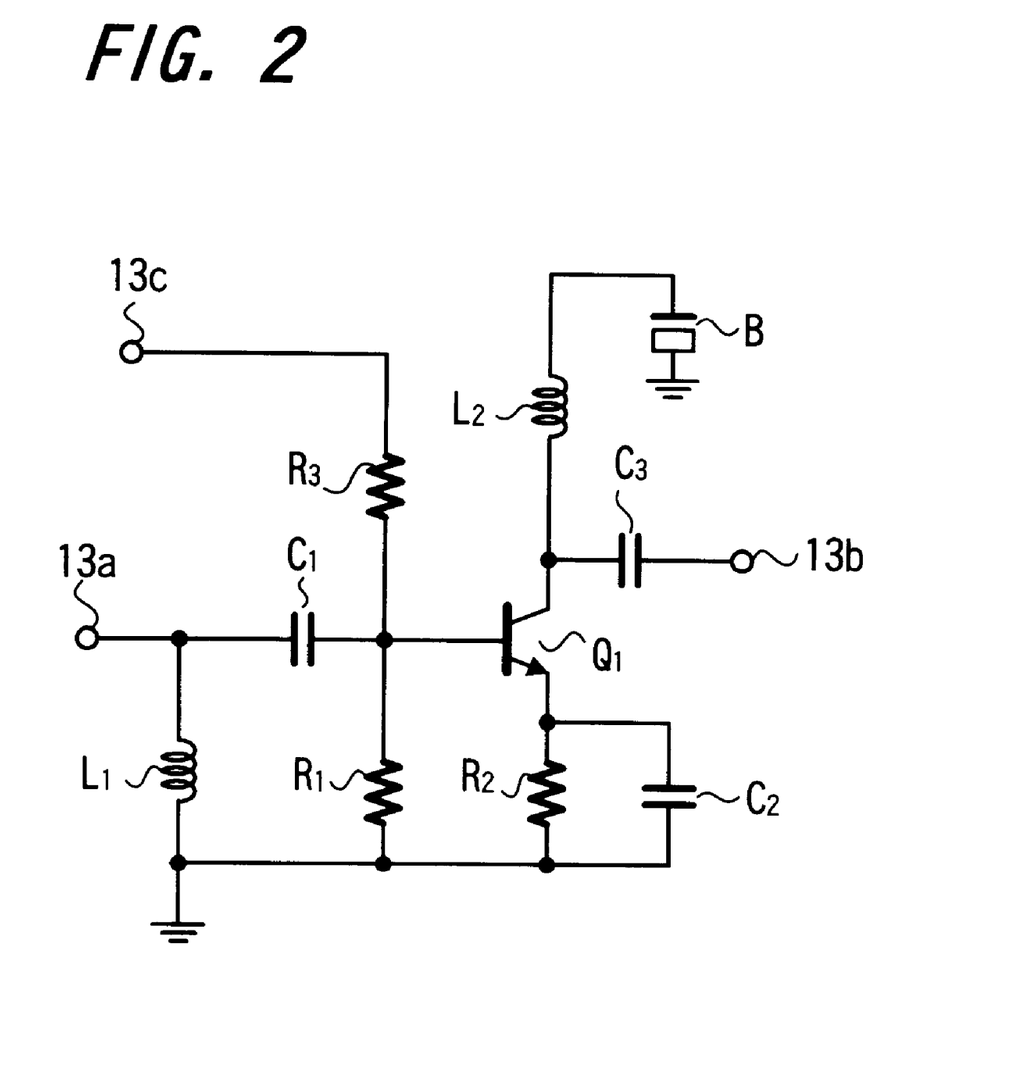
FIG. 2 is a schematic structural diagram showing an example of an MBE apparatus for executing the manufacturing method of the present invention.

The above-mentioned respective semiconductor layers 2 to 11 are epitaxially grown by using an MBE apparatus whose arrangement is schematically illustrated in FIG. 2. As shown in FIG. 2, this MBE apparatus includes a vacuum chamber 31 in which a substrate holder 22 for holding the substrate 1 on which the respective semiconductor layers 2 to 11 are deposited is disposed.

Then, a plurality of molecular beam sources 37 for emitting molecular beams of S, Se, Zn, Mg, Cd, Cl, Be or the like are arrayed in an opposing relation to the substrate 1 held on this substrate holder 22. These molecular beam sources 37, in particular, VI-group molecular beam sources should preferably be comprised of a valve cracking cell. A shutter 47 is located in front of the molecular beam source 37.

Also, there is disposed a plasma cell 33 for supplying plasma $N_2$.

Further, in the vacuum chamber 31, there are disposed a quadrupole mass analyzer 34, an RHEED (reflection high energy electron diffraction) electron gun 35 and a fluorescent screen 36 for receiving reflected electrons from the substrate 1.

Furthermore, there is provided a vacuum gauge 38 which is made slidable in front of the portion in which the substrate 1 is disposed.

By using this MBE apparatus, the respective materials are heated by the molecular beam sources 37 which are located in ultra high vacuum at a temperature necessary for obtaining a desired molecular beam intensity and a plurality of raw material molecular beams required upon deposition are simultaneously or alternately supplied to the substrate 1 which is heated at a desired temperature, whereby the target semiconductor layers 2 to 11 are epitaxially grown on the substrate 1, i.e. deposited as single-crystal thin films.

In the method according to the present invention, when the above-mentioned II–VI compound semiconductor is epitaxially deposited, in particular, the active layer is epitaxially deposited, the VI/II ratio is specified. In actual practice, since the layout or the like of the vacuum gauge becomes different at every apparatus and its sensitivity becomes different for every material, it is requested that the substantial VI/II ratio which participates in the film deposition of the II–VI compound semiconductor becomes different at every apparatus. Therefore, before the II–VI compound semiconductor is epitaxially deposited as a film, the above-mentioned VI/II ratio concerning each MBE apparatus should be calibrated. That is, VI/II=1 is normalized with respect to each apparatus.

One of methods of calibrating the VI/II ratio will be described below. Instead of the substrate 1 used in the target semiconductor light-emitting device, a similar substrate is held on the holder 22, molecular beam sources selected from II-group and VI-group are heated at a desired temperature and molecular beams from these molecular beam sources are irradiated on the substrate, thereby resulting in the semiconductor layers being deposited epitaxially. During the semiconductor layers are epitaxially deposited, the RHEED pattern is observed. Then, a VI/II ratio obtained when this pattern is observed such that reorientation structures of (2×1) pattern and c(2×2) pattern are simultaneously mixed is set to 1. In this connection, when the II-group molecular beam intensity is high, only the c(2×2) pattern is observed. When the VI-group molecular beam intensity is high, only the (2×1) pattern is observed. Then, the molecular beam intensity obtained at that time, i.e. flux amount is measured by measuring a vacuum degree with the vacuum gauge advanced in front of the substrate.

After the VI/II ratio was set to 1 by calibration as described above, according to the present invention, when the active layer 5 is deposited epitaxially, as mentioned before, the VI/II ratio should be selected to be larger than 1.1, preferably selected to be larger than 1.5, above all, selected in a range of from 1.5 to 10, and further the VI/II ratio should preferably be selected in a range of from 1.5 to 3.0.

Incidentally, the semiconductor layers other than the active layer 5, e.g. the cladding layers 3, 7, the guide layers 4, 6, the first and second semiconductor layers 8, 9, the superlattice layer 10, the contact layer 11 or the like may be epitaxially deposited under the condition that the VI/II ratio is approximately 1.

Figure 3:
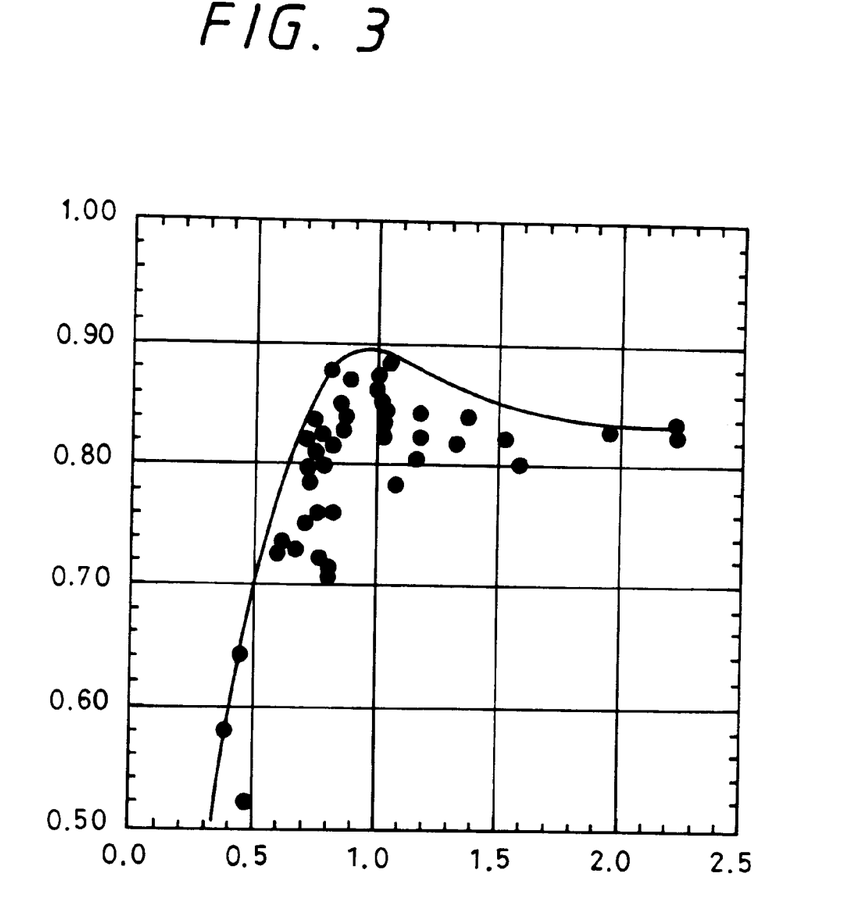
FIG. 3 is a graph showing measured results of a relationship between a VI/II ratio for growing the active layer of ZnCdSe and a mole fraction of Cd into ZnCdSe.

Other method of calibrating the VI/II ratio will be described below. The compositions of the semiconductor layers which are epitaxially deposited are analyzed. As shown in FIG. 3, for example, in the irradiation of molecular beams in which a ratio of Cd incorporated into the crystal relative to the amount of Cd in the molecular beam of supplied Cd in the ZnCdSe, i.e. Cd incorporating ratio demonstrates a peak, a molecular beam intensity is similarly measured by the vacuum gauge 38. Then, the ratio between the measured II-group and VI-group molecular beam intensities, e.g. Se/(Zn+Cd)) is set to VI/II=1.

Figure 4:
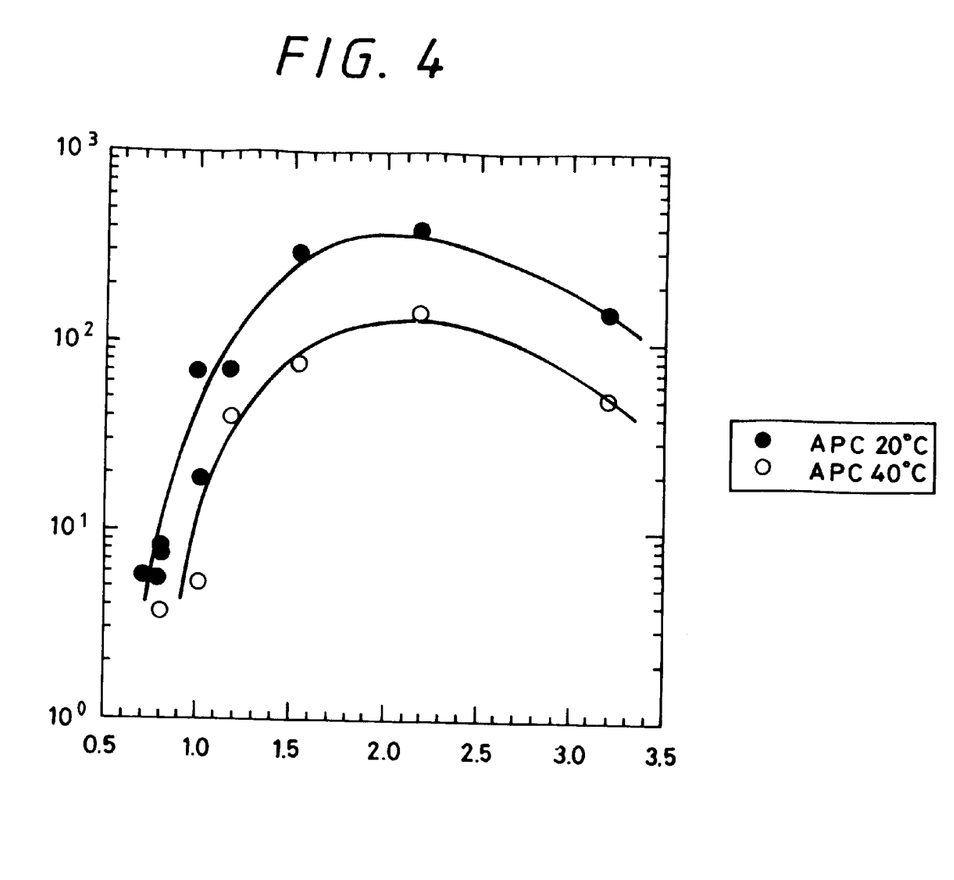
FIG. 4 is a graph showing measured results of a relationship between VI/II ratio for growing the active layer of the semiconductor light-emitting device obtained by the manufacturing method of the present invention and the life time thereof.

FIG. 4 is a graph in which measured results of laser life time relative to the VI/II ratio, i.e. Se/(Zn+Cd) obtained when the intensity of the laser output from the above-mentioned semiconductor laser in which the active layer is formed of a ZnCdSe layer is held at 1 mW by automatic power control under the temperature of 20° C. and 40° C. are plotted. A study of FIG. 4 reveals that a life time tends to reach a peak or a life time tends to be saturated when the VI/II ratio is larger than 1.1. Then, more preferably, when the VI/II ratio is higher than 1.5, the laser life time, in particular, may be improved. Furthermore, when the VI/II ratio falls within a range of 1.5 to 3.0, the laser life time may be improved more.

Figure 5:
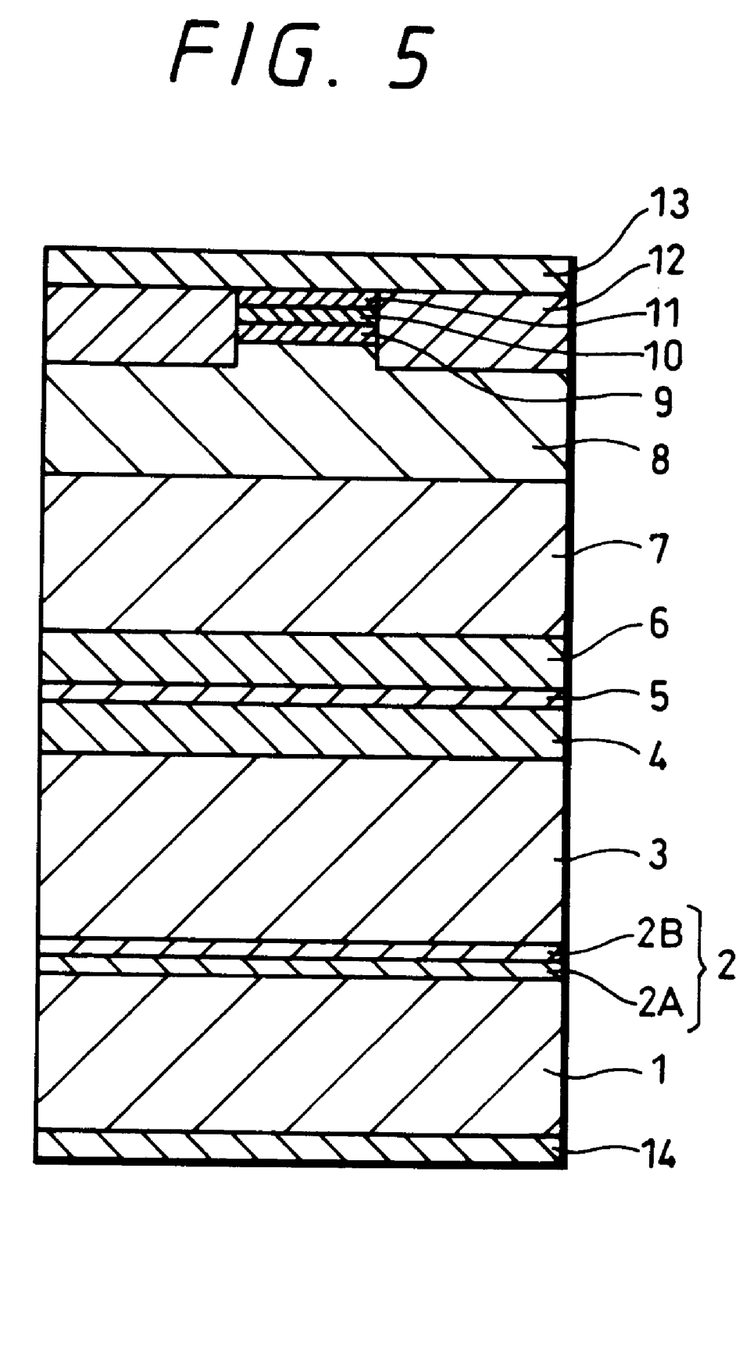
FIG. 5 is a schematic cross-sectional view showing another example of the semiconductor light-emitting device according to the manufacturing method of the present invention.

While the active layer is formed of the ZnCdSe layer in the semiconductor light-emitting device in which the cladding layer is formed of the ZnMgSSe-based layer as described above, the active layer may be formed of a ZnCdSSe layer. Also, the present invention is not limited to the above-mentioned example, and may be applied to a semiconductor light-emitting device formed of a semiconductor light-emitting device in which the cladding layer, for example, is formed of a ZnMgBeSSe layer with similar effects being achieved. FIG. 5 shows an example of such semiconductor light-emitting device. Also in this example, as shown in FIG. 5, on a first conductivity-type, e.g. n-type GaAs substrate 1, there are epitaxially deposited a first conductivity-type buffer layer 2, a first conductivity-type cladding layer 3, a first guiding layer 4, an active layer 5 having a quantum well structure, a second guide layer 6, a second conductivity-type, e.g. p-type cladding layer 7, a second conductivity-type first semiconductor layer 8, a second conductivity-type second semiconductor layer 9, a second conductivity-type superlattice layer 10 and a second conductivity-type contact layer 11, in that order, by the MBE method, for example. Across the thickness direction of the contact layer 11 and the superlattice structure 10 of the laminated semiconductor layer thus epitaxially deposited and on both sides of a stripe-like current path portion, there is formed a mesa-groove by etching. An insulating layer 12 made of $Al_2O_3$ or the like is buried in this mesa-groove.

Then, one electrode 13 is deposited on the contact layer 11 in an ohmic-contact fashion, and the other electrode 14 is deposited on the back surface of the substrate 1 in an ohmic-contact fashion.

As shown in FIG. 5, the buffer layer 2 may be comprised of a GaAs buffer layer 2A of III–V family compound semiconductor, for example, and a ZnBeSe buffer layer 2B of II–VI compound semiconductor having a thickness of 20 nm, for example, or the II–V family compound semiconductor buffer layer may be comprised of a ZnBeSe buffer layer having a thickness of 20 nm similarly to a ZnSe buffer layer having a thickness of 20 nm, for example.

The first conductivity-type cladding layer 3 is comprised of an n-type ZnMgBeSe mixed crystal layer having a thickness of 1 μm, for example.

The first guide layer 4 is comprised of an n-type or non-doped ZnBeSe mixed crystal layer having a thickness of 100 nm, for example.

The active layer 5 is comprised of a ZnCdSe mixed crystal layer or a ZnCdBeSe mixed crystal layer of a single quantum well structure having a thickness of 3.3 nm, for example. Also in this case, its lattice constant is slightly larger than the lattice constant (GaAs lattice constant) of the substrate 1.

The second guiding layer 6 is comprised of a p-type or non-doped ZnBeSe mixed crystal layer having a thickness of 100 nm, for example.

The second conductivity-type cladding layer 7 is comprised of a p-type ZnMgBeSe mixed crystal layer having a thickness of 1 μm, for example.

The first semiconductor layer 8 is comprised of a p-type ZnBeSe mixed crystal layer having a thickness of 1 μm, for example.

The second semiconductor layer 9 is comprised of a p-type ZnSe layer having a thickness of 100 nm, for example.

Besides, the superlattice layer 10 is formed of a superlattice layer of a laminated layer of a p-type ZnSe layer and a p-type BeTe layer, for example.

The contact layer 11 is comprised of a p-type BeTe layer having a thickness of 50 nm, for example.

Also in this case, when the active layer 5 is epitaxially deposited, the VI/II ratio is selected to be larger than 1.1 and should preferably be selected to be greater than 1.5.

Further, when the active layer 5 is epitaxially deposited, it is desirable that the VI/II ratio should be selected in a range of from 1.5 to 3.0.

Furthermore, while the in the above respective examples the active layer has the single quantum well structure as described above, the present invention is not limited thereto, and may be applied to a semiconductor light-emitting device having a multiple quantum well structure with similar effects being achieved.

As described above, according to the manufacturing method of the present invention, by specifying the VI/II ratio required when the active layer is epitaxially deposited, it is possible to extend a life time of a resultant semiconductor light-emitting device.

As described above, according to the manufacturing method of the present invention, the life time of the semiconductor light-emitting device may be extended to the degree that cannot be realized by the prior-art semiconductor light-emitting device such as a semiconductor laser or light-emitting diode, thereby making it possible to make the semiconductor light-emitting device become highly reliable.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. In a method of manufacturing a semiconductor light-emitting device made of a II–VI compound semiconductor in which at least more than one kind of elements of Zn, Be, Mg, Cd or Hg are used as a II-group element and at least more than one kind of elements of Se, S, Te are used as a VI-group element and which includes first conductivity type and second conductivity type cladding layers and an active layer between the cladding layers, said method of manufacturing a semiconductor light-emitting device characterized in that a supply ratio VI/II ration of VI-group element and II-group element required when the active layer is epitaxially deposited is selected to be greater than 1.1 and said active layer is deposited epitaxially, and said active layer is comprised of ZnCdSSe.

2. A method of manufacturing a semiconductor light-emitting device as claimed in claim 1, wherein a supply ratio VI/II ratio of VI-group element and II-group element required when the active layer is epitaxially deposited is selected to be greater than 1.5 and said active layer is deposited epitaxially.

3. A method of manufacturing a semiconductor light-emitting device as claimed in claim 1, wherein a supply ratio VI/II ratio of VI-group element and II-group element required when the active layer is epitaxially deposited is selected in a range of from 1.5 to 10 and said active layer is deposited epitaxially.

4. A method of manufacturing a semiconductor light-emitting device as claimed in claim 1, wherein a supply ratio VI/II ratio of VI-group element and II-group element required when the active layer is epitaxially deposited is selected in a range of from 1.5 to 3.0 and said active layer is deposited epitaxially.

5. In a method of manufacturing a semiconductor light-emitting device made of a II–VI compound semiconductor in which at least more than one kind of elements of Zn, Be, Mg, Cd or Hg are used as a II-group element and at least more than one kind of elements of Se, S, Te are used as a VI-group element and which includes first conductivity type and second conductivity type cladding layers and an active layer between the cladding layers, said method of manufacturing a semiconductor light-emitting device characterized in that a supply ratio VI/II ration of VI-group element and II-group element required when the active layer is epitaxially deposited is selected to be greater than 1.1 and said active layer is deposited epitaxially, and said active layer is comprised of a ZnCdSe or ZnCdSSe layer; wherein, a small fraction of said II-group elements in said active layer are 67% of zinc and 33% of cadmium.

6. A method of manufacturing a semiconductor light-emitting device as claimed in claim 5, wherein a supply ratio VI/II ration of VI-group element and II-group element required when the active layer is epitaxially deposited is selected to be greater than 1.5 and said active layer is deposited epitaxially.

7. A method of manufacturing a semiconductor light-emitting device as claimed in claim 5, wherein a supply ratio VI/II ratio of VI-group element and II-group element required when the active layer is epitaxially deposited is selected in a range of from 1.5 to 10 and said active layer is deposited epitaxially.

8. A method of manufacturing a semiconductor light-emitting device as claimed in claim 1, wherein a supply ratio VI/II ratio of VI-group element and II-group element required when the active layer is epitaxially deposited is selected in a range of from 1.5 to 3.0 and said active layer is deposited epitaxially.

9. A method of manufacturing a semiconductor light-emitting device as claimed in claims 1, wherein a small fraction of said II-group elements in said active layer are 67% of zinc and 33% of cadmium.

* * * * *